US012751342B2

(12) United States Patent
Liao et al.

(10) Patent No.: US 12,751,342 B2
(45) Date of Patent: Sep. 29, 2026

(54) SEMICONDUCTOR STRUCTURE WITH DAISY CHAIN AND A METHOD OF MANUFACTURING THE SAME

(71) Applicant: TAIWAN SEMICONDUCTOR MANUFACTURING COMPANY LTD., Hsinchu (TW)

(72) Inventors: Tse-Wei Liao, Hsinchu City (TW); Yang-Che Chen, Hsin-Chu City (TW); Chi-Hui Lai, Taichung City (TW); Wei-Yu Chou, Taichung City (TW); Hsiang-Tai Lu, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 485 days.

(21) Appl. No.: 18/347,530

(22) Filed: Jul. 5, 2023

(65) Prior Publication Data

US 2025/0015034 A1 Jan. 9, 2025

(51) Int. Cl.

| | |
|---|---|
| ***H10W 90/00*** | (2026.01) |
| ***H10W 74/01*** | (2026.01) |
| ***H10W 74/10*** | (2026.01) |
| *H10W 70/09* | (2026.01) |
| *H10W 70/60* | (2026.01) |
| *H10W 72/00* | (2026.01) |

(52) U.S. Cl.

CPC ......... *H10W 90/701* (2026.01); *H10W 74/01* (2026.01); *H10W 74/111* (2026.01); *H10W 70/09* (2026.01); *H10W 70/60* (2026.01); *H10W 72/072* (2026.01); *H10W 90/724* (2026.01)

(58) Field of Classification Search

CPC . H10W 90/701; H10W 74/01; H10W 74/111; H10W 70/09; H10W 70/60; H10W 72/072; H10W 90/724; H10W 72/20; H10W 70/611; H10W 70/614; H10W 70/685; H10W 74/117

See application file for complete search history.

(56) References Cited

U.S. PATENT DOCUMENTS 8,802,504 B1 8/2014 Hou et al.
8,803,292 B2 8/2014 Chen et al.
8,803,316 B2 8/2014 Lin et al.
8,993,380 B2 3/2015 Hou et al.
(Continued)

*Primary Examiner* — Marlon T Fletcher
*Assistant Examiner* — Christina A Sylvia
(74) *Attorney, Agent, or Firm* — WPAT LAW; Anthony King

(57) ABSTRACT

A semiconductor structure includes a first die; a molding surrounding the first die; a redistribution layer (RDL) disposed under the first die and the molding, and including a plurality of first conductive pads and a dielectric layer surrounding the plurality of first conductive pads; a second die disposed under the RDL, and including a plurality of first die pads over the second die; and a plurality of first conductive bumps disposed between the RDL and the second die, wherein each of the plurality of first conductive bumps is electrically coupled with corresponding one of the plurality of first die pads and corresponding one of the plurality of first conductive pads, the plurality of first die pads are respectively arranged at corners of the second die, and the plurality of first conductive bumps are electrically connected in series.

20 Claims, 13 Drawing Sheets

(56) References Cited

U.S. PATENT DOCUMENTS

| | | | | |
|---|---|---|---|---|
| 9,281,254 | B2 | 3/2016 | Yu et al. | |
| 9,299,649 | B2 | 3/2016 | Chiu et al. | |
| 9,372,206 | B2 | 6/2016 | Wu et al. | |
| 9,425,126 | B2 | 8/2016 | Kuo et al. | |
| 9,443,783 | B2 | 9/2016 | Lin et al. | |
| 9,496,189 | B2 | 11/2016 | Yu et al. | |
| 2020/0294937 | A1* | 9/2020 | Chen | H10W 42/00 |
| 2021/0398908 | A1* | 12/2021 | Jin | H10W 70/614 |
| 2022/0359358 | A1* | 11/2022 | Kim | H01L 25/0652 |

* cited by examiner

SEMICONDUCTOR STRUCTURE WITH DAISY CHAIN AND A METHOD OF MANUFACTURING THE SAME

BACKGROUND

The semiconductor industry has experienced rapid growth due to ongoing improvements in the integration density of a variety of electrical components. To accommodate the miniaturized scale of the semiconductor device, various technologies and applications have been developed for the packaging, involving greater numbers of different components with different functions. Improvement in integration density has resulted from iterative reduction of minimum feature size, which allows more components to be integrated into a given area.

However, the manufacturing of the semiconductor device involve many steps and operations on such a small and thin semiconductor device. The manufacturing of the semiconductor device in a miniaturized scale becomes more complicated. An increase in a complexity of manufacturing the semiconductor device may cause deficiencies such as poor electrical interconnection, delamination of components, or other issues, resulting in a high yield loss of the semiconductor device. As such, there are many challenges for modifying a structure of the semiconductor devices and improving the manufacturing operations.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
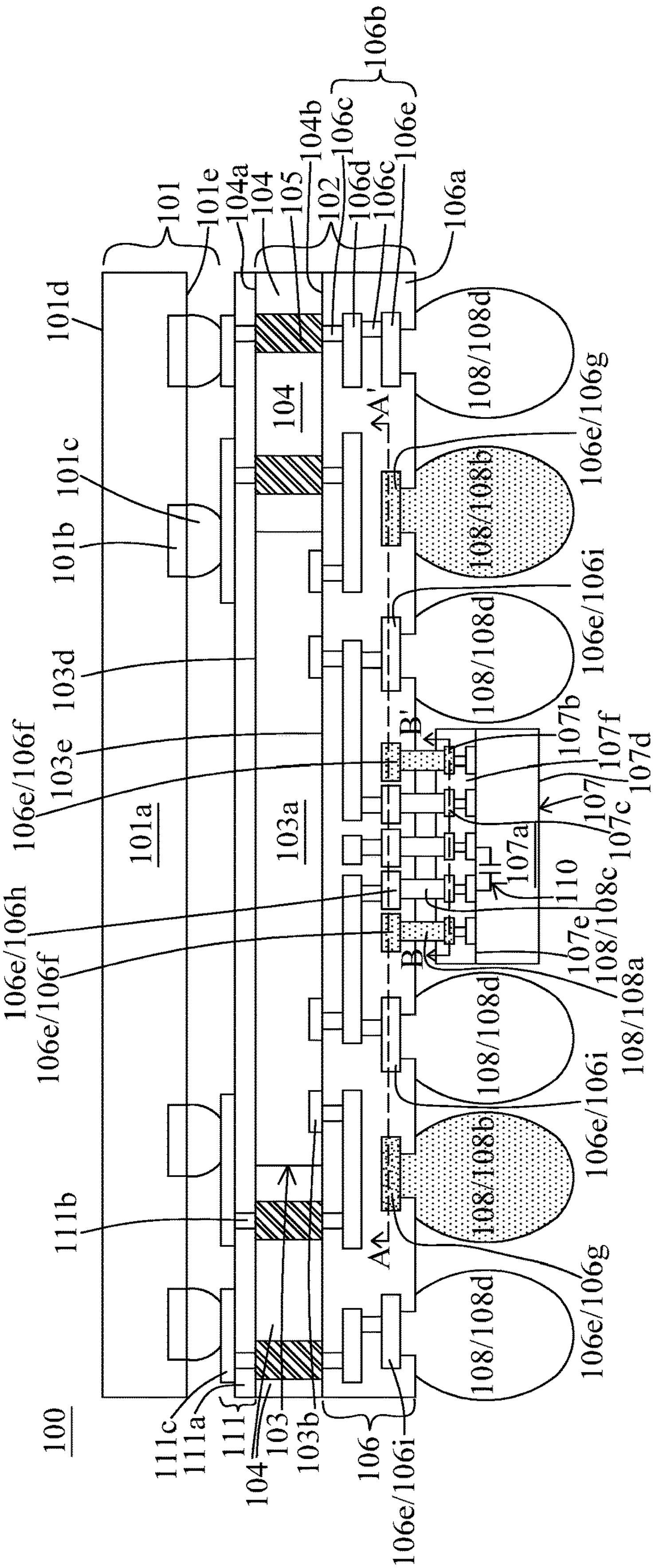
FIG. 1 is a schematic cross-sectional view of a semiconductor structure in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially." "approximately" and "about" generally mean within a value or range that can be contemplated by people having ordinary skill in the art. Alternatively, the terms "substantially." "approximately" and "about" mean within an acceptable standard error of the mean when considered by one of ordinary skill in the art. People having ordinary skill in the art can understand that the acceptable standard error may vary according to different technologies.

Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In the present disclosure, a semiconductor structure and a method of manufacturing a semiconductor structure are provided. The semiconductor structure includes a first die, a redistribution layer under the first die, and a second die disposed under the redistribution layer and electrically connected to the first die through the redistribution layer. A daisy chain is embedded in the redistribution layer and the second die for evaluating a reliability of a bonding between the second die and the redistribution layer. Other features may also be included. In some embodiments, the method of manufacturing the semiconductor structure includes forming the daisy chain within the redistribution layer and the second die, bonding the second die with the redistribution layer, and measuring an electrical resistance of the daisy chain. Other processes may also be included. As a result, the reliability of the bonding between the second die and the redistribution layer can be evaluated based on the electrical resistance measurement.

FIG. 1 is a cross-sectional view of a semiconductor structure 100 in accordance with some embodiments of the present disclosure. In some embodiments, the semiconductor structure 100 is a stacked structure having several dies stacked over each other. In some embodiments, the semiconductor structure 100 is a package on package (POP), that dies or packages are stacked over each other. In some embodiments, the semiconductor structure 100 includes system on integrated circuit (SoIC) structure, integrated fan out (InFO) structure or the like. In some embodiments, the semiconductor structure 100 is a package or a part of a package.

In some embodiments, the semiconductor structure 100 includes a first die 101. In some embodiments, the first die 101 is a logic die, which may be a central processing unit (CPU) die, a micro control unit (MCU) die, an input-output (IO) die, a baseband (BB) die, an application processor (AP) die, or the like. In some embodiments, the first die 101 is a memory die such as a dynamic random-access memory (DRAM) die or a static random-access memory (SRAM) die, or may be another type of die. The first die 101 may include active devices (not shown) such as transistors and/or diodes, and may include passive devices (not shown) such as capacitors, inductors, resistors, or the like.

In some embodiments, the first die 101 includes a first die substrate 101*a*, a first die pad 101*b* and a connector 101*c*. In some embodiments, the first die substrate 101*a* includes semiconductive material such as silicon, germanium, gallium, arsenic, or a combination thereof. In some embodiments, the first die substrate 101*a* is a silicon substrate. In some embodiments, the first die substrate 101*a* includes a back side 101*d* and a front side 101*e* opposite to the back side 101*d*. Several circuitries and electrical components are disposed over or at the front side 101*e*, while no device is disposed over or at the back side 101*d*.

In some embodiments, the first die pad 101*b* is disposed over or on the front side 101*e* of the first die substrate 101*a*. In some embodiments, the first die pad 101*b* is electrically connected to a circuitry external to the first die 101, such that a circuitry of the first die 101 is electrically connected to the circuitry external to the first die 101 through the first die pad 101*b*. The first die pad 101*b* is configured to electrically couple with a conductive structure. The first die pad 101*b* is an I/O terminal of the first die 101. In some embodiments, the first die pad 101*b* includes gold, silver, copper, nickel, tungsten, aluminum, palladium and/or alloys thereof.

In some embodiments, the connector 101*c* is disposed at the first die pad 101*b*. The connector 101*c* includes conductive material such as solder, copper, nickel, gold or etc. In some embodiments, the connector 101*c* is a solder ball, a ball grid array (BGA) ball, controlled collapse chip connection (C4) bump, microbump, a pillar, a post or the like. The connector 101*c* is configured to connect the first die 101 to an external circuitry.

In some embodiments, the semiconductor structure 100 includes a fan out (InFO) structure 102 disposed under the first die 101. In some embodiments, the fan out structure 102 includes a second die 103, a molding 104, a through via 105 and a redistribution layer (RDL) 106. The second die 103 is surrounded by the molding 104. The through via 105 extends through the molding 104 and is adjacent to the second die 103. The RDL 106 is disposed under the second die 103 and the molding 104. I/O terminals of the second die 103 are fanned out and redistributed over the second die 103 in a greater area.

In some embodiments, an interconnect layer 111 is disposed between the fan out structure 102 and the first die 101. In some embodiments, the interconnect layer 111 includes an insulative layer 111*a* over the second die 103 and the molding 104, a connecting member 111*b* surrounded by the insulative layer 111*a*, and a receiving member 111*c* disposed over the connecting member 111*b* and the insulative layer 111*a*. In some embodiments, the insulative layer 111*a* is disposed over the back side 103*d* of the second die 103 and the back side 104*a* of the molding 104. In some embodiments, the insulative layer 111*a* includes dielectric material such as silicon oxide, silicon nitride, polyimide, or the like.

In some embodiments, the connecting member 111*b* is disposed over and coupled with the through via 105. In some embodiments, the connecting member 111*b* extends through the insulative layer 111*a*. In some embodiments, the receiving member 111*c* is disposed over and coupled with the connecting member 111*b*. In some embodiments, the connector 101*c* is disposed over and coupled with the receiving member 111*c*, so that the first die 101 is electrically connected to the through via 105 through the interconnect layer 111. In some embodiments, the connecting member 111*b* and the receiving member 111*c* include conductive material such as copper, silver, gold or the like.

In some embodiments, the second die 103 is a system on chip (SOC) that integrates all electronic components into a single die. In some embodiments, the second die 103 is a logic die, an input-output (IO) die, an application processor (AP) die, or the like. In some embodiments, the second die 103 is a memory die such as a dynamic random-access memory (DRAM) die or a static random-access memory (SRAM) die, or may be another type of die. The second die 103 may include active devices (not shown) such as transistors and/or diodes, and may include passive devices (not shown) such as capacitors, inductors, resistors, or the like.

In some embodiments, the second die 103 includes a second die substrate 103*a* and a second die pad 103*b*. In some embodiments, the second die substrate 103*a* includes semiconductive material such as silicon, germanium, gallium, arsenic, or a combination thereof. In some embodiments, the second die substrate 103*a* is a silicon substrate. In some embodiments, the second die substrate 103*a* includes a back side 103*d* and a front side 103*e* opposite to the back side 103*d*. Several circuitries and electrical components are disposed over or at the front side 103*e*, while no device is disposed over or at the back side 103*d*.

In some embodiments, the second die pad 103*b* is disposed over or on the front side 103*e* of the second die substrate 103*a*. In some embodiments, the second die pad 103*b* is electrically connected to a circuitry external to the second die 103, such that a circuitry of the second die 103 is electrically connected to the circuitry external to the second die 103 through the second die pad 103*b*. The second die pad 103*b* is configured to electrically couple with a conductive structure. The second die pad 103*b* is I/O terminal of the second die 103. In some embodiments, the second die pad 103*b* includes gold, silver, copper, nickel, tungsten, aluminum, palladium and/or alloys thereof.

In some embodiments, the molding 104 surrounds the second die 103*a*. The molding 104 contacts a sidewall of the second die substrate 103*a*. In some embodiments, the molding 104 includes molding compound, epoxy, polymer or the like. In some embodiments, the molding 104 is configured to protect the second die 103. In some embodiments, the molding 104 includes a back side 104*a* and a front side 104*b* opposite to the back side 104*a*. In some embodiments, the back side 104*a* of the molding 104 is substantially coplanar with the back side 103*d* of the second die 103, and the front side 104*b* of the molding 104 is substantially coplanar with the front side 103*e* of the second die 103.

In some embodiments, the through via 105 is surrounded by the molding 104. The through via 105 extends through the molding 104. The through via 105 extends between the back side 104*a* and the front side 104*b* of the molding 104. In some embodiments, the through via 105 is a through molding via (TMV). In some embodiments, the through via 105 includes conductive material such as gold, silver, copper, nickel, tungsten, aluminum, palladium and/or alloys thereof.

In some embodiments, the RDL 106 is disposed at the front side 103*e* of the second die 103 and the front side 104*b* of the molding 104. In some embodiments, the RDL 106 re-routes a path from the second die 103 so as to redistribute I/O terminals of the second die 103 at the front side 104*b* of the molding 104. In some embodiments, the RDL 106 includes a dielectric layer 106*a* and an interconnect structure 106*b* surrounded by the dielectric layer 106*a*. In some embodiments, the dielectric layer 106*a* is disposed under the second die 103*a* and the molding 104. In some embodiments, the dielectric layer 106*a* is in contact with the front side 103*e* of the second die 103 and the front side 104*b* of the molding 104. In some embodiments, the dielectric layer 106*a* includes dielectric material such as silicon oxide, silicon nitride, silicon carbide, silicon oxynitride, polymer, polybenzoxazole (PBO), polyimide, benzocyclobutene (BCB), or the like.

In some embodiments, the interconnect structure 106*b* includes several conductive vias 106*c* and several conductive members 106*d*. In some embodiments, the interconnect structure 106*b* includes conductive material such as gold, silver, copper, nickel, tungsten, aluminum, palladium and/or alloys thereof. The conductive via 106*c* is electrically coupled with the conductive member 106*d*.

In some embodiments, the conductive via 106*c* is partially exposed through the dielectric layer 106*a* and is electrically coupled with the through via 105, so that the interconnect structure 106*b* is electrically connected to the through via 105. In some embodiments, the conductive via 106*c* is partially exposed through the dielectric layer 106*a* and is electrically coupled with the second die pad 103*b* of the second die 103, so that the interconnect structure 106*b* is electrically connected to the second die 103. In some embodiments, the conductive member 106*d* laterally extends within the dielectric layer 106*a*.

Figure 2:
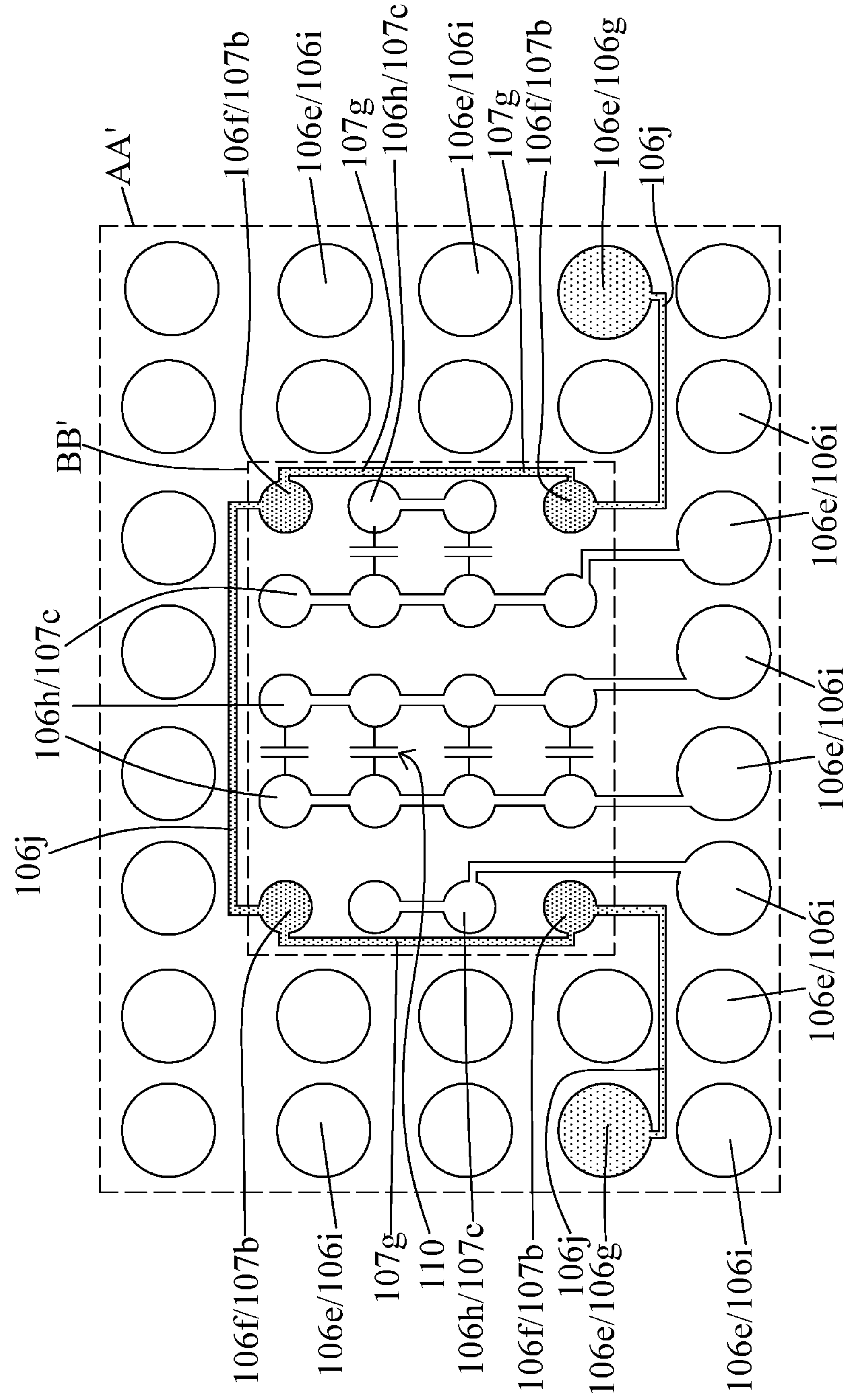
FIG. 2 is a schematic top cross-sectional view of a portion of the semiconductor structure along a line AA' and another portion of the semiconductor structure along a line BB' in FIG. 1.
Figure 3:
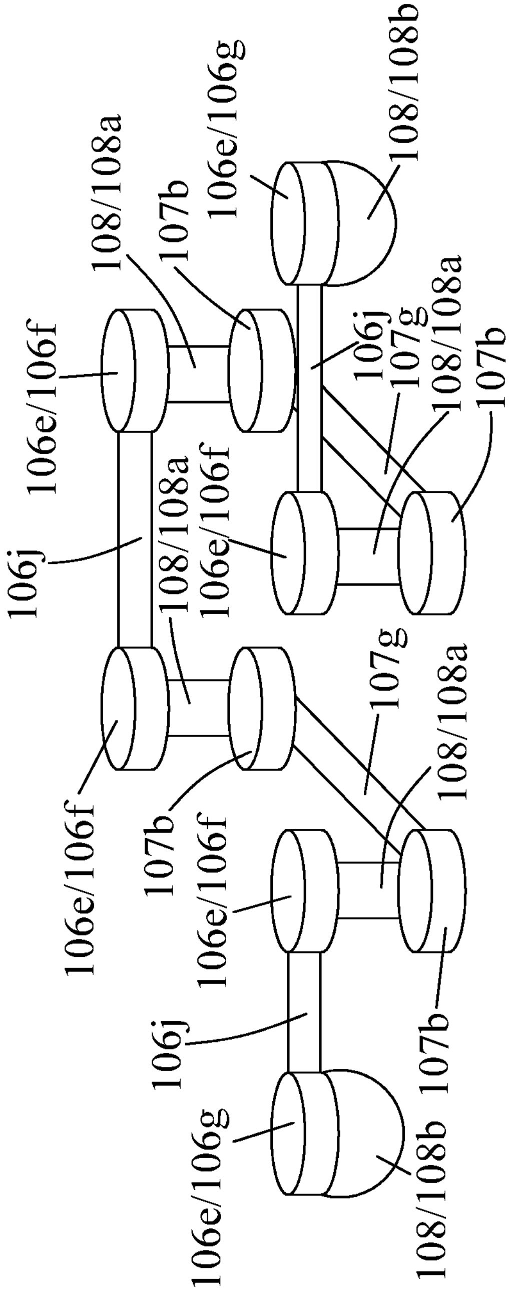
FIG. 3 is a schematic perspective view of a daisy chain in the semiconductor structure of FIG. 1.

FIG. 2 illustrates a top cross-sectional view along a line AA' across a portion of the RDL 106 and along a line BB' across a portion of a third die 107. FIG. 3 illustrates a schematic perspective view of a daisy chain (discuss later). Referring to FIGS. 1 and 2, in some embodiments, the interconnect structure 106*b* includes several conductive pads 106*c*. In some embodiments, the conductive pads 106*e* are electrically connected to conductive members 106*d* and the conductive vias 106*c*. In some embodiments, the conductive pads 106*e* are surrounded by and partially exposed through the dielectric layer 106*a*. In some embodiments, the conductive pads 106*e* includes a first conductive pad 106*f*, a second conductive pad 106*g*, a third conductive pad 106*h* and a fourth conductive pad 106*i*. In some embodiments, a cross-sectional area of the first conductive pad 106*f* is substantially smaller than a cross-sectional area of the second conductive pad 106*g*.

Referring to FIG. 3, in some embodiments, the first conductive pad 106*f* is connected to the second conductive pad 106*g* by a first interconnect member 106*j* extending within and surrounded by the dielectric layer 106*a*. In some embodiments, the first interconnect member 106*j* is one of the conductive members 106*d*. In some embodiments, the first conductive pads 106*f* are electrically connected by the first interconnect member 106*j*. In some embodiments, the first interconnect member 106*j* electrically connects the first conductive pad 106*f* and the second conductive pad 106*g*, so that the first conductive pad 106*f* and the second conductive pad 106*g* are electrically connected in series. In some embodiments, a number of the first conductive pads 106*f* is four or more.

In some embodiments, the third conductive pad 106*h* is electrically coupled with the fourth conductive pad 106*i*. In some embodiments, the third conductive pad 106*h* is electrically coupled with the fourth conductive pad 106*i* through some of conductive members 106*d*. In some embodiments, the first conductive pad 106*f* and the second conductive pad 106*g* are electrically isolated from the third conductive pad 106*h* and the fourth conductive pad 106*i*. In some embodiments, the fourth conductive pad 106*i* is electrically connected to a power or an electrical ground. In some embodiments, a total number of the third conductive pads 106*h* is substantially greater than a total number of the first conductive pads 106*f*. In some embodiments, a ratio of the total number of the third conductive pads 106*h* to the total number of the first conductive pads 106*f* is substantially greater than 3:1.

In some embodiments, the semiconductor structure 100 includes the third die 107 disposed under the RDL 106. In some embodiments, the third die 107 includes passive devices such as capacitors, inductors, resistors, or the like. In some embodiments, the third die 107 includes several capacitors 110. In some embodiments, the third die 107 includes a third die substrate 107*a*, an inter-layer dielectric (ILD) layer 107*f*, a third die pad 107*b* and a fourth die pad 107*c*. The third die pad 107*b* and the fourth die pad 107 are disposed over the third die substrate 107*a* and surrounded by the ILD layer 107*f*.

In some embodiments, the third die substrate 107*a* includes semiconductive material such as silicon, germanium, gallium, arsenic, or a combination thereof. In some embodiments, the third die substrate 107*a* is a silicon substrate. In some embodiments, the third die substrate 107*a* includes a back side 107*d* and a front side 107*e* opposite to the back side 107*d*. Several circuitries and electrical components are disposed over or at the front side 107*e*, while no device is disposed over or at the back side 107*d*. The ILD layer 107*f* is disposed over the front side 107*e*. In some embodiments, the ILD layer 107*f* includes dielectric material such as silicon oxide, silicon oxynitride, polyimide, silicon nitride or the like.

In some embodiments, the third die pad 107*b* and the fourth die pad 107*c* are disposed over or on the front side 107*e* of the third die substrate 107*a*. In some embodiments, the third die pad 107*b* and the fourth die pad 107*c* are respectively electrically connected to the conductive via 106*c* and/or the conductive pad 106*e* within the dielectric layer 106*a* of the RDL 106. In some embodiments, the third die pad 107*b* and the fourth die pad 107*c* are I/O terminals of the third die 107. In some embodiments, the third die pad 107*b* and the fourth die pad 107*c* include gold, silver, copper, nickel, tungsten, aluminum, palladium and/or alloys thereof. In some embodiments, the third die pads 107*b* are electrically connected in series by a second interconnect member 107*g* extending within the third die 107. In some embodiments, the second interconnect member 107*g* extends within the ILD layer 107*f*. In some embodiments, the second interconnect member 107*g* extends along a periphery of the third die 107.

In some embodiments, some of the fourth die pads 107*c* are electrically connected in series. In some embodiments, some of the fourth die pads 107*c* are electrically connected in series to a power or a ground. In some embodiments, the capacitor 110 is disposed between and connected to one of the fourth die pads 107*c* connecting to a power and another one of the fourth die pads 107*c* connecting to a ground.

In some embodiments, the third die pads 107*b* are respectively arranged at corners of the third die 107. Referring to FIG. 2, the third die pads 107*b* are located at four corners of the third die 107 respectively. In some embodiments, a number of the third die pads 107*b* is four or more. In some embodiments, a total number of the fourth die pads 107*c* is substantially greater than a total number of the third die pads 107*b*. In some embodiments, a ratio of the total number of the fourth die pads 107*c* to the total number of the third die pads 107*b* is substantially greater than 3:1.

In some embodiments, the third die 107 is bonded under the RDL 106 by several conductive bumps 108. The conductive bumps 108 are disposed between the RDL 106 and the third die 107. In some embodiments, the conductive bump 108 includes conductive material such as solder, copper, nickel, gold or etc. In some embodiments, the conductive bump 108 is a solder ball, a ball grid array (BGA) ball, controlled collapse chip connection (C4) bump, microbump, a pillar, a post or the like. The conductive bump 108 is configured to connect the third die 107 to an external circuitry.

In some embodiments, the conductive bumps 108 include several first conductive bumps 108*a* and several third conductive bumps 108*c*. In some embodiments, the first conductive bump 108*a* and the third conductive bump 108*c* are respectively a solder ball, microbump, a pillar, a post or the like. In some embodiments, each of the first conductive bumps 108 is electrically coupled with corresponding one of the first conductive pads 106*f* and corresponding one of the third die pads 107*b*.

In some embodiments, the first conductive bumps 108*a* are electrically connected in series. In some embodiments, the first conductive bumps 108*a*, the first conductive pads 106*f*, the second conductive pads 106*g* and the third die pads 107*b* are electrically connected in series as part of the daisy chain. In some embodiments, the daisy chain is configured to detect a reliability of bonding between the third die 107 and the RDL 106. In some embodiments, the daisy chain is configured to detect reliability of bonding between the third die pads 107*b* and the first conductive pads 106*f* by the first conductive bumps 108*a*. In some embodiments, a number of the first conductive bumps 108*a* is four or more. In some embodiments, the capacitors 110 are electrically isolated from the daisy chain.

In some embodiments, each of the third conductive bumps 108*c* is electrically coupled with corresponding one of the third conductive pads 106*h* and corresponding one of the fourth die pads 107*c*. In some embodiments, the third conductive bumps 108*c*, the third conductive pads 106*h*, the fourth conductive pads 106*i* and the fourth die pads 107*c* are electrically connected isolated from the first conductive bumps 108*a*, the first conductive pads 106*f*, the second conductive pads 106*g* and the third die pads 107*b*. In some embodiments, the third conductive bumps 108*c*, the third conductive pads 106*h*, the fourth conductive pads 106*i* and the fourth die pads 107*c* are electrically connected to a power or a ground. In some embodiments, the third die 107 is electrically connected to the second die 103 through the third conductive bumps 108*c* and the third conductive pads 106*h*.

In some embodiments, the conductive bumps 108 include several second conductive bumps 108*b* and several fourth conductive bumps 108*d*. In some embodiments, the second conductive bump 108*b* and the fourth conductive bump 108*d* are respectively a solder ball, a ball grid array (BGA) ball, controlled collapse chip connection (C4) bump, a pillar, a post or the like. The second conductive bumps 108*b* and the fourth conductive bumps 108*d* are disposed under the RDL 106 and surround the third die 107. In some embodiments, the second conductive bump 108*b* and the fourth conductive bump 108*d* are respectively substantially larger than the first conductive bump 108*a*. In some embodiments, the second conductive bump 108*b* and the fourth conductive bump 108*d* are respectively substantially larger than the third conductive bump 108*c*.

In some embodiments, each of the second conductive bumps 108*b* is electrically coupled with corresponding one of the second conductive pads 106*g*. In some embodiments, the second conductive bumps 108*b* are electrically connected to the first conductive bumps 108*a*, the first conductive pads 106*f* and the third die pads 107*b* in series to form the daisy chain. In some embodiments, a voltage is applied between the second conductive bumps 108*b* for detecting the reliability of the bonding between the third die pads 107*b* and the first conductive pads 106*f* by the first conductive bumps 108*a*. That is, the voltage is applied to the daisy chain for the detection. If the daisy chain in an open circuit state was detected, it indicates that the bonding of the third die 107 to the RDL 106 is problematic or is potentially failure. If the daisy chain in a closed circuit state was detected, it indicates that the bonding of the third die 107 to the RDL 106 is fine or is not potentially failure. In some embodiments, the detection is performed by measuring an electrical resistance of the daisy chain. If a predetermined electrical resistance is measured, it indicates that the bonding of the third die 107 to the RDL 106 is fine or is not potentially failure. Otherwise, the bonding is problematic or is potentially failure.

In some embodiments, the fourth conductive bumps 108*d* is electrically coupled with corresponding one of the fourth conductive pads 106*i*. In some embodiments, the fourth conductive bumps 108*d*, the fourth conductive pads 106*i*, the third conductive pads 106*h*, the third conductive bumps 108*c* and the fourth die pads 107*c* are electrically in series as a functional chain or a part of a functional chain. In some embodiments, the fourth conductive bumps 108*d*, the fourth conductive pads 106*i*, the third conductive pads 106*h*, the third conductive bumps 108*c* and the fourth die pads 107*c* are electrically in series to a power or a ground. In some embodiments, the fourth conductive bumps 108*d*, the fourth conductive pads 106*i*, the third conductive pads 106*h*, the third conductive bumps 108*c* and the fourth die pads 107*c* are electrically isolated from the daisy chain. In some embodiments, the second conductive bumps 108*b* and/or the fourth conductive bumps 108*d* are bonded on a circuit board (e.g. printed circuit board PCB, or the like).

Figure 4:
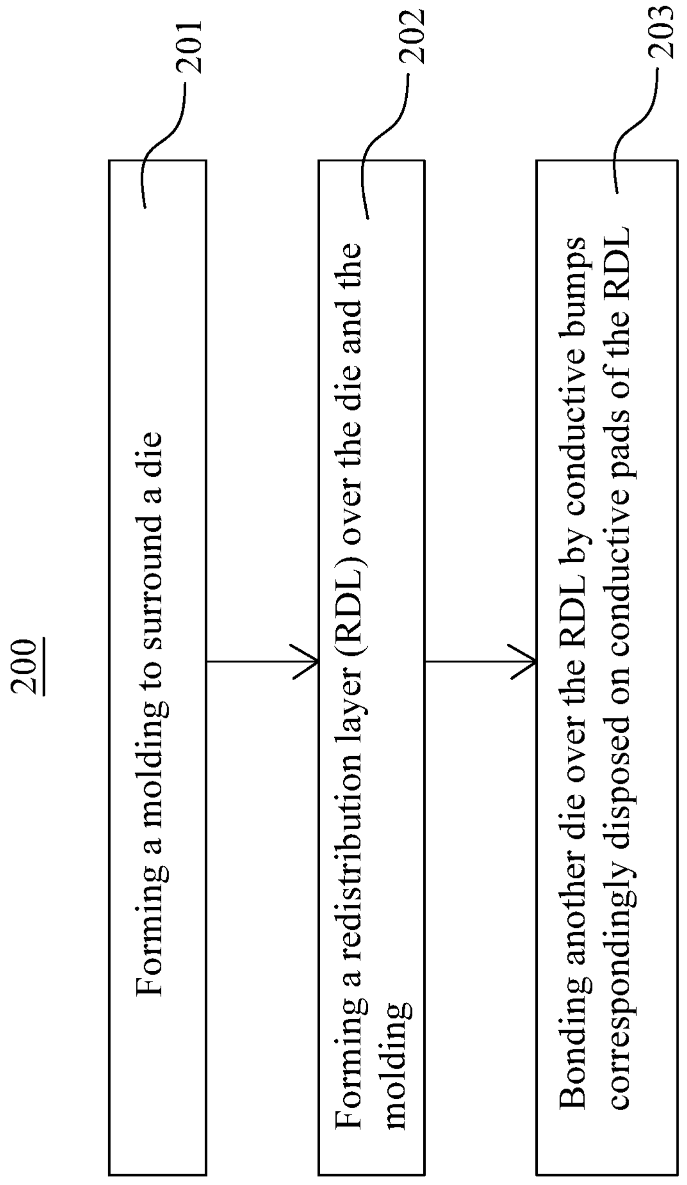
FIG. 4 is a flowchart of a method for forming a semiconductor structure in accordance with some embodiments of the present disclosure.

In the present disclosure, a method of manufacturing a semiconductor structure 100 is also disclosed. In some embodiments, the semiconductor structure 100 is formed by a method 200. The method 200 includes a number of operations and the description and illustration are not deemed as a limitation as the sequence of the operations. FIG. 4 is an embodiment of the method 200 of manufacturing the semiconductor structure 100. The method 200 includes a number of operations (201, 202 and 203).

Figure 5:
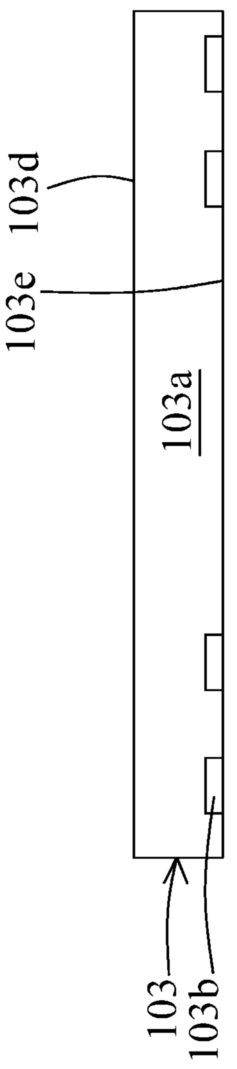
FIGS. 5 to 15 are cross-sectional views of one or more stages of the method for forming a semiconductor structure in accordance with some embodiments of the present disclosure.
Figure 6:
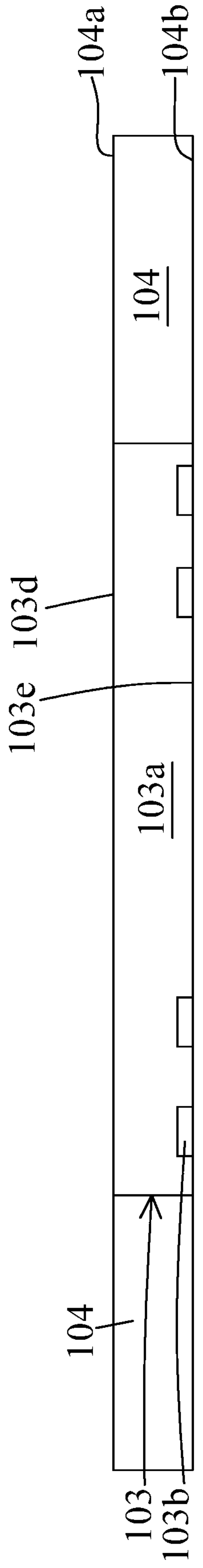
Figure 7:
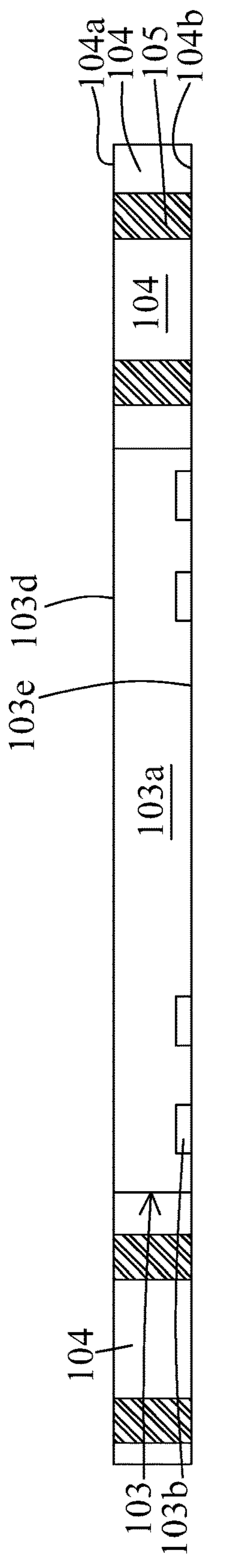

In operation 201, a molding 104 is formed to surround a second die 103 as shown in FIGS. 5 to 7. In some embodiments, the second die 103 is provided as shown in FIG. 5, and then the molding 104 is formed to surround the second die 103 as shown in FIG. 6. The second die 103 includes a second die substrate 103*a*, a front side 103*e*, a back side 103*d* and a second die pad 103*b* over the front side 103*c*. In some embodiments, the molding 104 has a front side 104*b* substantially coplanar with the front side 103*e* of the second die 103, and a back side 104*a* substantially coplanar with the back side 103*d* of the second die 103. In some embodiments, the molding 104 is formed by disposing a molding material around the second die 103, and then grinding the molding material until the front side 104*b* of the molding 104 is substantially coplanar with the front side 103*e* of the second die 103 and the back side 104*a* of the molding 104 is substantially coplanar with the back side 103*d* of the second die 103.

In some embodiments, a through via 105 is formed within the molding 104 as shown in FIG. 7. The through via 105 extends through the molding 104. In some embodiments, the through via 105 is formed by removing some portions of the molding 104 and then disposing a conductive material within the molding 104. In some embodiments, the conductive material is disposed by electroplating or any other suitable operations.

Figure 8:
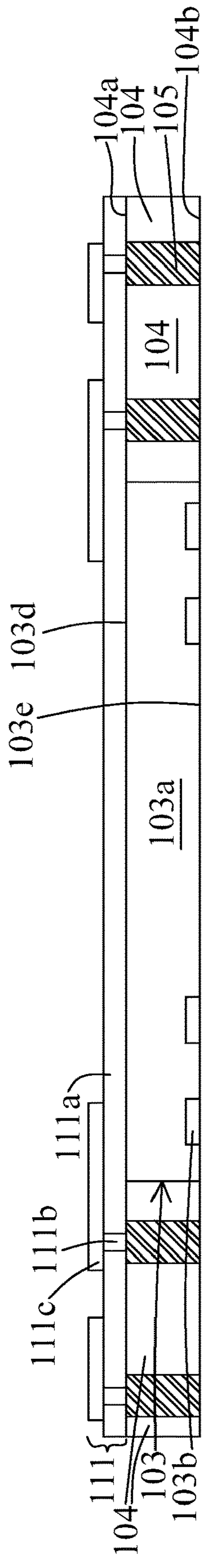

In some embodiments, an interconnect layer 111 is formed over the second die 103, the molding 104 and the through via 105 as shown in FIG. 8. In some embodiments, the interconnect layer 111 is formed after the formation of the molding 104. In some embodiments, the formation of the interconnect layer 111 includes forming an insulative layer 111*a* over the backside 103*d* of the second die 103 and the back side 104*a* of the molding 104, forming a connecting member 111*b* within the insulative layer 111, and forming a receiving member 111*c* over the insulative layer 111*a*. In some embodiments, the connecting member 111*b* is disposed above and coupled with the through via 105. In some embodiments, the receiving member 111*c* is coupled with the connecting member 111*b* and extends over the insulative layer 111*a*.

In some embodiments, the insulative layer 111*a* includes dielectric material such as silicon oxide, silicon nitride, polyimide, or the like. In some embodiments, the connecting member 111*b* and the receiving member 111*c* include conductive material such as copper, silver, gold or the like. In some embodiments, the insulative layer 111*a* is formed by deposition or any other suitable operations. In some embodiments, the connecting member 111*b* and the receiving member 111*c* are formed by electroplating or any other suitable operations.

Figure 9:
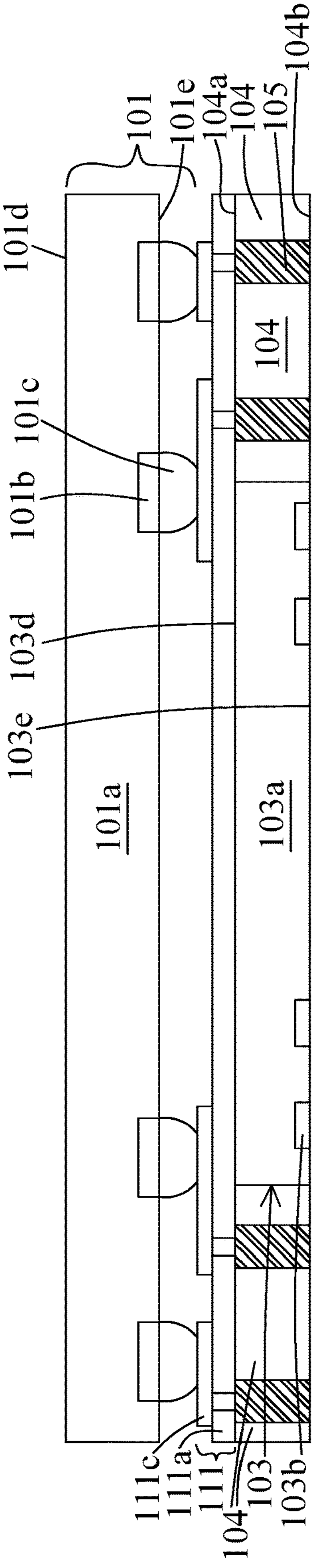
Figure 10:
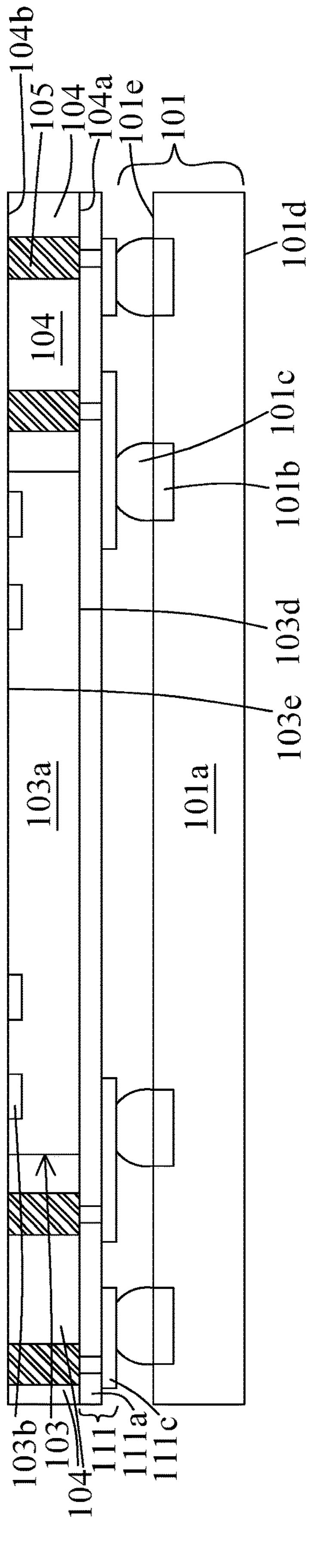

In some embodiments, a first die 101 is bonded over the second die 103 and the molding 104 by connectors 101*c* as shown in FIG. 9. The first die 101 includes a first die substrate 101*a*, a back side 101*d*, a front side 101*e*, and a first die pad 101*b* disposed over the front side 101*e*. In some embodiments, the connector 101*c* bonds to the first die pad 101*b* and the receiving member 111*c*. In some embodiments, the first die 101 is electrically connected to the through via 105 through the connector 101*c*, the receiving member 111*c* and the connecting member 111*b*. In some embodiments, an intermediate structure as shown in FIG. 9 is flipped upside down as shown in FIG. 10 after the bonding of the first die 101.

Figure 11:
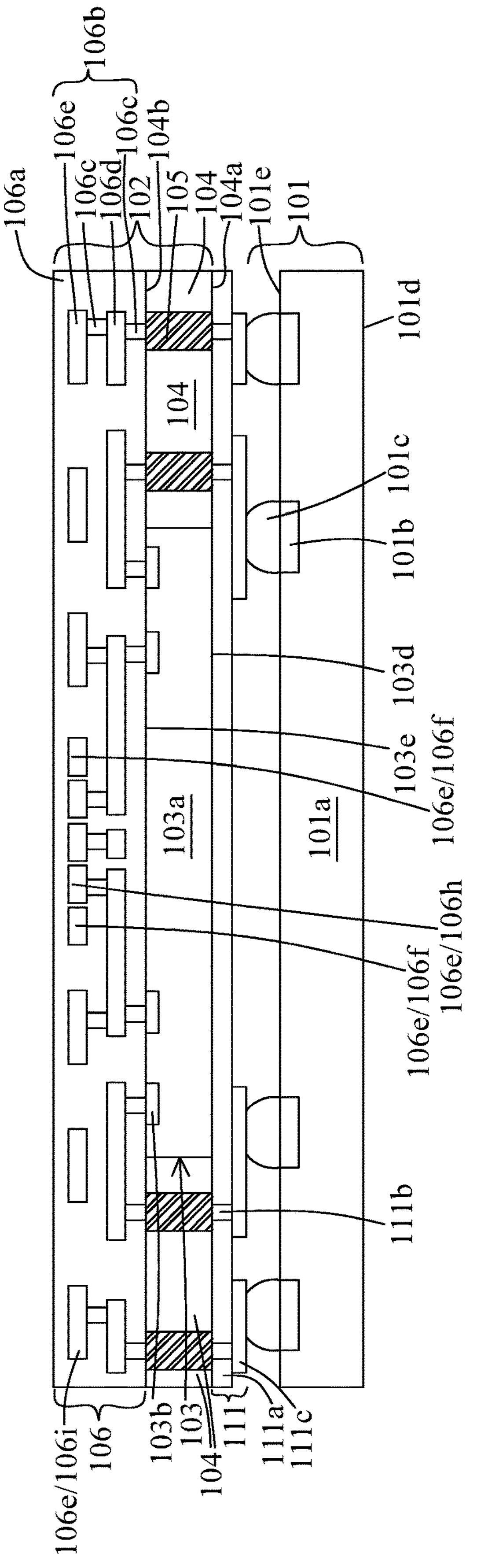
Figure 12:
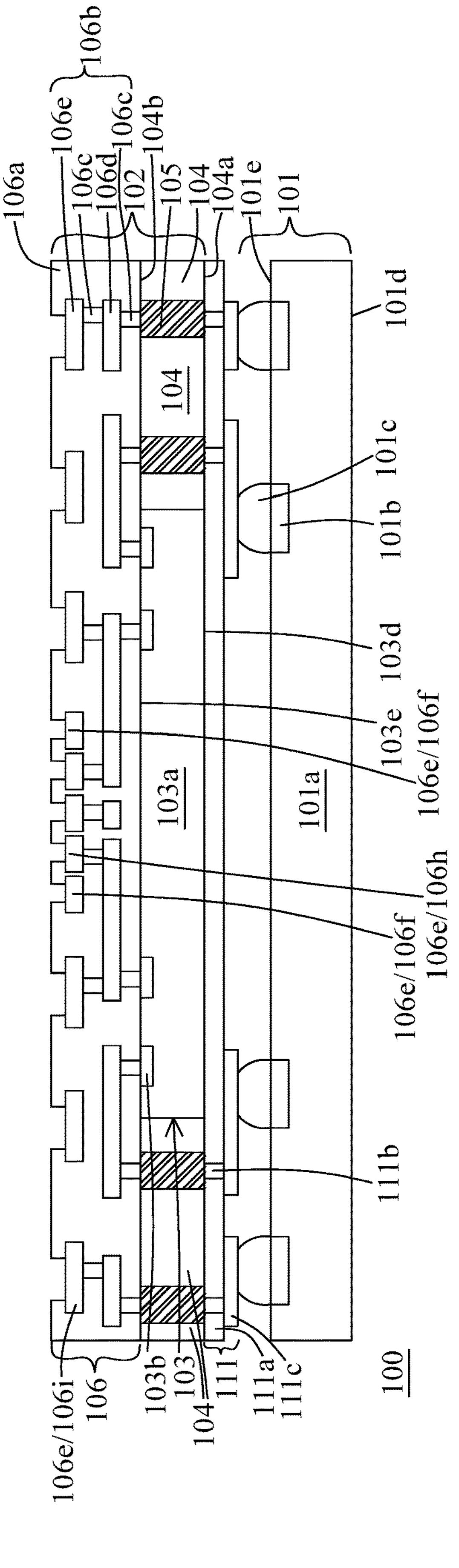

In operation 202, a redistribution layer (RDL) 106 is formed over the second die 103 and the molding 104 as shown in FIGS. 11 and 12. In some embodiments, the formation of the RDL 106 includes forming a dielectric layer 106*a* over the front side 103*e* of the second die 103 and the front side 104*b* of the molding 104, and forming an interconnect structure 106*b* within the dielectric layer 106*a*. In some embodiments, the interconnect structure 106*b* includes conductive vias 106*c*, conductive members 106*d* and conductive pads 106*e* formed within the dielectric layer 106*a*. In some embodiments, the conductive via 106*c* is coupled with the conductive member 106*d*. In some embodiments, the conductive via 106*c* is disposed over and coupled with the through via 105. In some embodiments, the conductive via 106*c* is disposed over and coupled with the second die pad 103*b*. In some embodiments, the conductive via 106*c* is coupled with the conductive pad 106*c*. In some embodiments, some portions of the dielectric layer 106*a* are removed to expose some of the conductive pads 106*e* as shown in FIG. 12. In some embodiments, the portions of the dielectric layer 106*a* are removed by etching or any other suitable operations. In some embodiments, the conductive pads 106*e* includes a first conductive pad 106*f*, a second conductive pad 160*g*, a third conductive pad 106*h* and a fourth conductive pad 106*i*.

Figure 13:
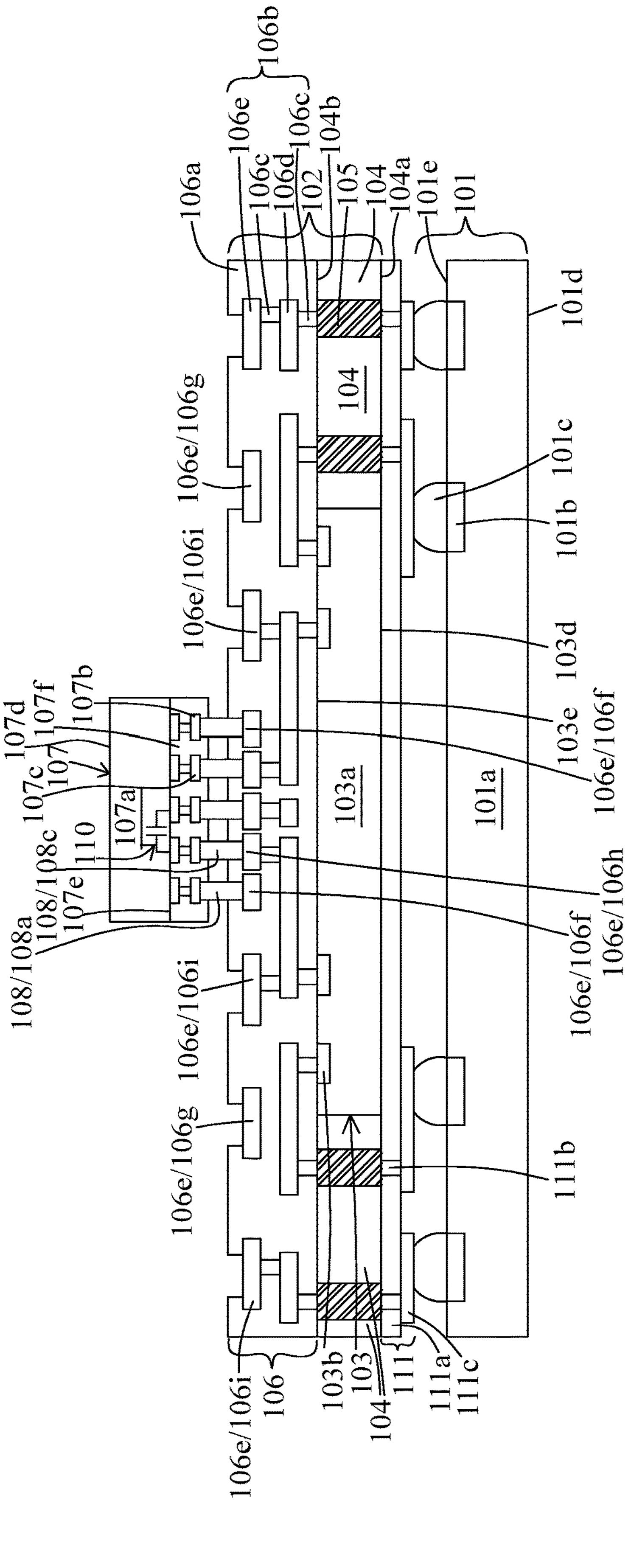

In operation 203, a third die 107 is bonded over the RDL 106 by conductive bumps 108 as shown in FIG. 13. In some embodiments, the third die 107 is electrically connected to the second die 103 through the conductive bumps 108 and the interconnect structure 106*b* of the RDL 106. In some embodiments, the third die 107 is electrically connected to the first die 101 through the conductive bumps 108, the interconnect structure 106*b*, the through via 105, the connecting member 111*b* and the receiving member 111*c*. The third die 107 includes a third die substrate 107*a*, a front side 107*e*, a back side 107*d*, an ILD layer 107*f* over the front side 107*e*, a third die pad 107*b* exposed through the ILD layer 107*f* and a fourth die pad 107*c* exposed through the ILD layer 107*f*. In some embodiments, the ILD layer 107*f* faces to the dielectric layer 106*a* of the RDL 106.

In some embodiments, the conductive bumps 108 includes a first conductive bump 108*a* and a third conductive bump 108*c*. In some embodiments, the first conductive bump 108*a* is bonded with the third die pad 107*b*, and the third conductive bump 108*c* is bonded with the fourth die pad 107*c*. In some embodiments, the first conductive bump 108*a* is disposed above and bonded with the first conductive pad 106*f*, and the third conductive bump 108*c* is disposed over and bonded with the third conductive pad 106*h*. In some embodiments, the third die pad 107*b*, the first conductive bump 108*a* and the first conductive pad 106*f* are electrically connected in series.

Figure 14:
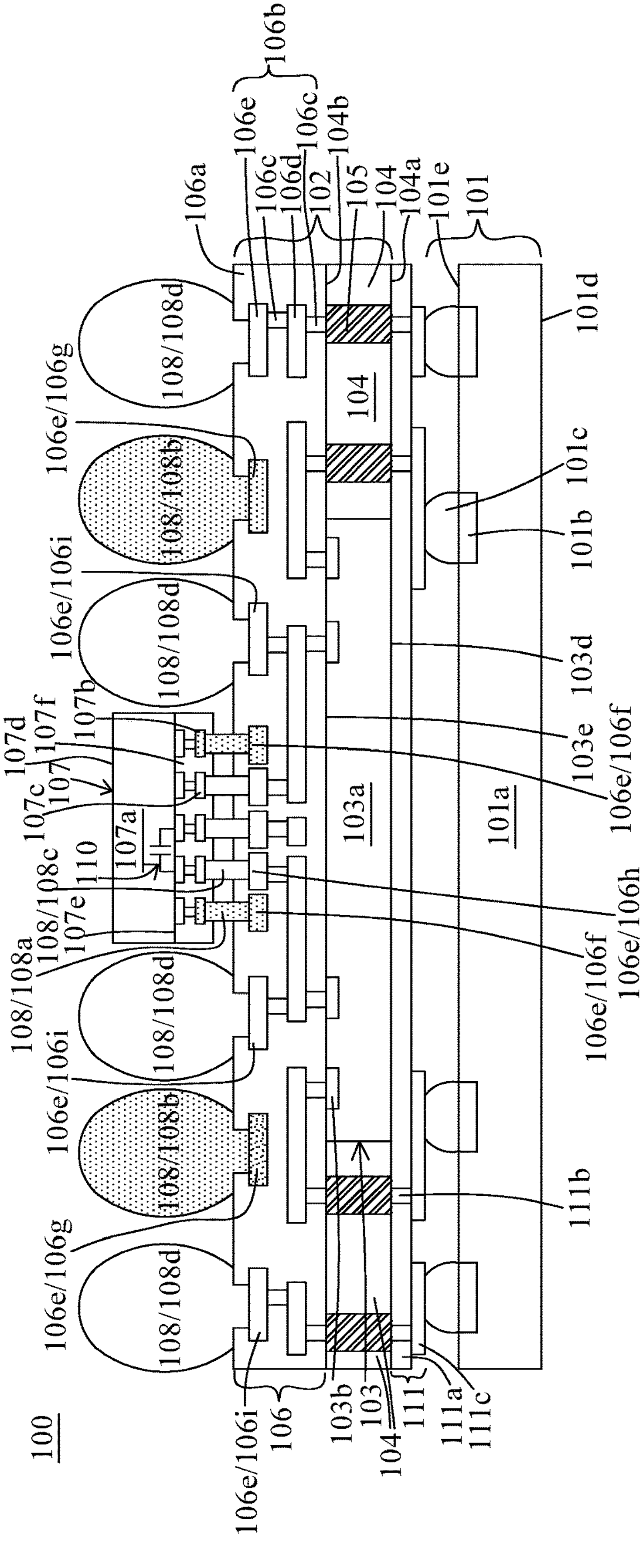

In some embodiments, the conductive bumps 108 includes a second conductive bump 108*b* and a fourth conductive bump 108*d*. In some embodiments, after the bonding of the third die 107 over the RDL 106, the second conductive bump 108*b* is bonded with the second conductive pad 106*g*, and the fourth conductive bump 108*d* is bonded with the fourth conductive pad 106*i* as shown in FIG. 14. In some embodiments, the third die pad 107*b*, the first conductive bump 108*a*, the first conductive pad 106*f* and the second conductive bump 108*b* are electrically connected in series as a daisy chain. In some embodiments, the semiconductor structure 100 is formed as shown in FIG. 14.

Figure 15:
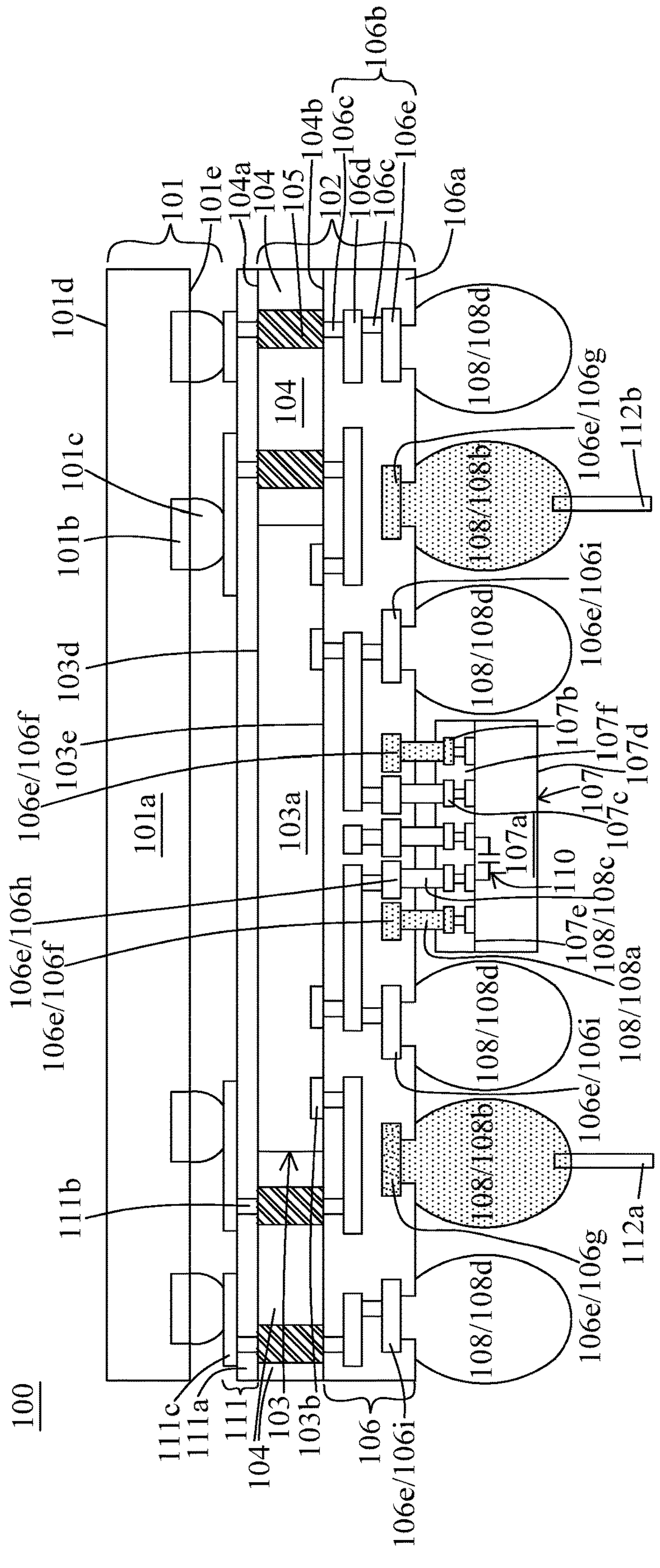

In some embodiments, a voltage is applied between the second conductive bumps 108*b* for detecting the reliability of the bonding between the third die pads 107*b* and the first conductive pads 106*f* by the first conductive bumps 108*a*. That is, the voltage is applied to the daisy chain for the detection. In some embodiments, a first probe 112*a* is in contact with one of the second conductive bumps 108*b*, and a second probe 112*b* is in contact with another one of the second conductive bumps 108*b* as shown in FIG. 15. The voltage is applied between the first probe 112*a* and the second probe 112*b*. If the daisy chain in an open circuit state was detected, it indicates that the bonding of the third die 107 to the RDL 106 (i.e. the bonding of the first conductive pad 106*f* and the third die pad 107*b* by the first conductive bump 108*a*) is problematic or is potentially failure. If the daisy chain in a closed circuit state was detected, it indicates that the bonding of the third die 107 to the RDL 106 is fine or is not potentially failure. In some embodiments, an electrical resistance between the first probe 112*a* and the second probe 112*b* is measured. If a predetermined electrical resistance is measured, it indicates that the bonding of the third die 107 to the RDL 106 is fine or is not potentially failure. Otherwise, the bonding is problematic or is potentially failure.

One aspect of this disclosure relates to a semiconductor structure. The semiconductor structure includes a first die; a molding surrounding the first die; a redistribution layer (RDL) disposed under the first die and the molding, and including a plurality of first conductive pads and a dielectric layer surrounding the plurality of first conductive pads; a second die disposed under the RDL, and including a plurality of first die pads over the second die; and a plurality of first conductive bumps disposed between the RDL and the second die, wherein each of the plurality of first conductive bumps is electrically coupled with corresponding one of the plurality of first die pads and corresponding one of the plurality of first conductive pads, the plurality of first die pads are respectively arranged at corners of the second die, and the plurality of first conductive bumps are electrically connected in series.

In some embodiments, the plurality of first conductive pads, the plurality of first conductive bumps and the plurality of first die pads are electrically connected in series. In some embodiments, the semiconductor structure further comprises a plurality of second conductive pads surrounded by the dielectric layer, and a plurality of second conductive bumps disposed under the RDL, wherein each of the plurality of second conductive bumps is electrically coupled with corresponding one of the plurality of second conductive pads. In some embodiments, the plurality of second conductive pads and the plurality of first conductive pads are electrically connected in series.

In some embodiments, one of the plurality of first conductive pads is connected to one of the plurality of second conductive pads by a first interconnect member extending within and surrounded by the dielectric layer. In some embodiments, one of the plurality of first die pads is connected to another one of the plurality of first die pads by a second interconnect member extending within the second die. In some embodiments, the second interconnect member extends along a periphery of the second die. In some embodiments, the second die includes a plurality of second die pads over the second die, the RDL includes a plurality of third conductive pads surrounded by the dielectric layer, and each of a plurality of third conductive bumps is electrically coupled with corresponding one of the plurality of second die pads and corresponding one of the plurality of third conductive pads.

In some embodiments, the plurality of first conductive pads, the plurality of first conductive bumps and the plurality of first die pads are electrically isolated from the plurality of third conductive pads, the plurality of third conductive bumps and the plurality of second die pads. In some embodiments, the plurality of second die pads are electrically connected in series. In some embodiments, the first die is electrically connected to the second die through the plurality of third conductive pads and the plurality of third conductive bumps.

In some embodiments, the RDL includes a plurality of fourth conductive pads surrounded by the dielectric layer, and each of a plurality of fourth conductive bumps is disposed under the RDL and is electrically coupled with corresponding one of the plurality of fourth conductive pads. In some embodiments, one of the plurality of fourth conductive pads is electrically coupled with one of the plurality of third conductive pads. In some embodiments, the plurality of fourth conductive bumps are electrically connected to a power or a ground. In some embodiments, a number of the plurality of first conductive bumps is four.

An aspect of this disclosure relates to a semiconductor structure. The semiconductor structure includes a redistribution layer (RDL) including a plurality of first conductive pads, a plurality of second conductive pads, and a dielectric layer surrounding the plurality of first conductive pads and the plurality of second conductive pads; a die disposed under the RDL, and including a plurality of die pads over the die; and a plurality of first conductive bumps disposed between the RDL and the die; and a plurality of second conductive bumps disposed under the RDL, wherein each of the plurality of first conductive bumps is electrically coupled with corresponding one of the plurality of die pads and corresponding one of the plurality of first conductive pads, each of the plurality of second conductive bumps is electrically coupled with corresponding one of the plurality of second conductive pads, the plurality of die pads are respectively arranged at corners of the die, and the plurality of first conductive pads, the plurality of first conductive bumps, the plurality of die pads, the plurality of second conductive pads and the plurality of second conductive bumps are electrically connected in series as a daisy chain.

In some embodiments, the die is a passive device and includes a plurality of capacitors electrically isolated from the daisy chain. In some embodiments, each of the plurality of first conductive bumps is smaller than each of the plurality of second conductive bumps.

An aspect of this disclosure relates to a method of manufacturing a semiconductor structure. The method includes forming a molding to surround a first die; forming a redistribution layer (RDL) over the first die and the molding, wherein the formation of the RDL includes forming a plurality of first conductive pads at least partially exposed through a dielectric layer; and bonding a second die over the RDL by a plurality of first conductive bumps correspondingly disposed on the plurality of first conductive pads, wherein the plurality of first conductive pads and the plurality of first conductive bumps are electrically connected in series.

In some embodiments, the method further includes detecting the bonding of the second die by measuring an electrical resistance between two of the plurality of first conductive pads.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:

a first die;

a molding surrounding the first die;

a redistribution layer (RDL) disposed under the first die and the molding, and including a plurality of first conductive pads and a dielectric layer surrounding the plurality of first conductive pads;

a second die disposed under the RDL, and including a plurality of first die pads over the second die; and a plurality of first conductive bumps disposed between the RDL and the second die, wherein each of the plurality of first conductive bumps is electrically coupled with corresponding one of the plurality of first die pads and corresponding one of the plurality of first conductive pads, the plurality of first die pads are respectively arranged at corners of the second die, and the plurality of first conductive bumps are electrically connected in series, and wherein the second die includes a plurality of second die pads over the second die, the RDL includes a plurality of second conductive pads surrounded by the dielectric layer, and each of a plurality of second conductive bumps is electrically coupled with corresponding one of the plurality of second die pads and corresponding one of the plurality of second conductive pads.

2. The semiconductor structure of claim 1, wherein the plurality of first conductive pads, the plurality of first conductive bumps and the plurality of first die pads are electrically connected in series.

3. The semiconductor structure of claim 1, further comprising a plurality of third conductive pads surrounded by the dielectric layer, and a plurality of third conductive bumps disposed under the RDL, wherein each of the plurality of third conductive bumps is electrically coupled with corresponding one of the plurality of third conductive pads.

4. The semiconductor structure of claim 3, wherein the plurality of third conductive pads and the plurality of first conductive pads are electrically connected in series.

5. The semiconductor structure of claim 3, wherein one of the plurality of first conductive pads is connected to one of the plurality of third conductive pads by a first interconnect member extending within and surrounded by the dielectric layer.

6. The semiconductor structure of claim 1, wherein one of the plurality of first die pads is connected to another one of the plurality of first die pads by a second interconnect member extending within the second die.

7. The semiconductor structure of claim 6, wherein the second interconnect member extends along a periphery of the second die.

8. The semiconductor structure of claim 1, wherein the plurality of first conductive pads, the plurality of first conductive bumps and the plurality of first die pads are electrically isolated from the plurality of second conductive pads, the plurality of second conductive bumps and the plurality of second die pads.

9. The semiconductor structure of claim 1, wherein the plurality of second die pads are electrically connected in series.

10. The semiconductor structure of claim 1, wherein the first die is electrically connected to the second die through the plurality of second conductive pads and the plurality of second conductive bumps.

11. The semiconductor structure of claim 1, wherein the RDL includes a plurality of fourth conductive pads surrounded by the dielectric layer, and each of a plurality of fourth conductive bumps is disposed under the RDL and is electrically coupled with corresponding one of the plurality of fourth conductive pads.

12. The semiconductor structure of claim 11, wherein one of the plurality of fourth conductive pads is electrically coupled with one of the plurality of second conductive pads.

13. The semiconductor structure of claim 11, wherein the plurality of fourth conductive bumps are electrically connected to a power or a ground.

14. The semiconductor structure of claim 1, wherein a number of the plurality of first conductive bumps is four.

15. A semiconductor structure, comprising:

a redistribution layer (RDL) including a plurality of first conductive pads, a plurality of second conductive pads, and a dielectric layer surrounding the plurality of first conductive pads and the plurality of second conductive pads;

a die disposed under the RDL, and including a plurality of die pads over the die; and a plurality of first conductive bumps disposed between the RDL and the die; and a plurality of second conductive bumps disposed under the RDL, wherein each of the plurality of first conductive bumps is electrically coupled with corresponding one of the plurality of die pads and corresponding one of the plurality of first conductive pads, each of the plurality of second conductive bumps is electrically coupled with corresponding one of the plurality of second conductive pads, the plurality of die pads are respectively arranged at corners of the die, and the plurality of first conductive pads, the plurality of first conductive bumps, the plurality of die pads, the plurality of second conductive pads and the plurality of second conductive bumps are electrically connected in series as a daisy chain, wherein the RDL includes a plurality of third conductive pads surrounded by the dielectric layer, and each of a plurality of third conductive bumps is electrically coupled with corresponding one of the plurality of second die pads and corresponding one of the plurality of third conductive pads.

16. The semiconductor structure of claim 15, wherein the die is a passive device and includes a plurality of capacitors electrically isolated from the daisy chain.

17. The semiconductor structure of claim 15, wherein each of the plurality of first conductive bumps is smaller than each of the plurality of second conductive bumps.

18. A semiconductor structure, comprising:

a redistribution layer (RDL) including a plurality of first conductive pads, a plurality of second conductive pads, and a dielectric layer surrounding the plurality of first conductive pads and the plurality of second conductive pads; and a die disposed under the RDL, and including a plurality of die pads between the die and the plurality of first conductive pads;

wherein the plurality of die pads are respectively arranged at corners of the die, and the plurality of die pads, the plurality of first conductive pads and the plurality of second conductive pads are electrically connected in series, and wherein the RDL includes a plurality of third conductive pads surrounded by the dielectric layer, and each of a plurality of first conductive bumps is electrically coupled with corresponding one of the plurality of die pads and corresponding one of the plurality of third conductive pads.

19. The semiconductor structure of claim 18, further comprising a plurality of second conductive bumps disposed between the RDL and the die, and a plurality of third conductive bumps disposed under the RDL, wherein each of the plurality of second conductive bumps is electrically coupled with corresponding one of the plurality of die pads and corresponding one of the plurality of first conductive pads, and each of the plurality of third conductive bumps is electrically coupled with corresponding one of the plurality of second conductive pads.

20. The semiconductor structure of claim 18, wherein one of the plurality of first conductive pads is connected to one of the plurality of second conductive pads by an interconnect member extending within and surrounded by the dielectric layer.

* * * * *